(12) United States Patent
Matsumoto

(10) Patent No.: US 9,978,922 B2
(45) Date of Patent: May 22, 2018

(54) HEAT SINK USING GRAPHITE AND LIGHT EMITTING DEVICE

(71) Applicant: Stanley Electric Co., Ltd., Tokyo (JP)

(72) Inventor: Naoko Matsumoto, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 2 days.

(21) Appl. No.: 15/296,855

(22) Filed: Oct. 18, 2016

(65) Prior Publication Data

US 2017/0117451 A1   Apr. 27, 2017

(30) Foreign Application Priority Data

Oct. 23, 2015   (JP) ................. 2015-209401

(51) Int. Cl.
  *H01L 33/64*   (2010.01)
  *H01S 5/024*   (2006.01)
(52) U.S. Cl.
  CPC ........ *H01L 33/642* (2013.01); *H01S 5/02469* (2013.01)
(58) Field of Classification Search
  CPC .................................... H01L 33/642
  USPC ............................................. 257/99
  See application file for complete search history.

(56) References Cited

U.S. PATENT DOCUMENTS

2011/0133236 A1* 6/2011 Nozaki ................. H01L 33/642
                                                                 257/98

FOREIGN PATENT DOCUMENTS

| JP | 2009-99878 A | | 5/2009 | |
|----|---|---|---|---|
| JP | 2009099878 | * | 5/2009 | ........... H01L 23/373 |
| JP | 2012-136022 A | | 7/2012 | |

* cited by examiner

*Primary Examiner* — Kenneth Parker
*Assistant Examiner* — Warren H Kilpatrick
(74) *Attorney, Agent, or Firm* — Kenealy Vaidya LLP

(57) ABSTRACT

A heat sink can include a fin using graphite, and a base with a high heat dissipation film formed on its surface to be provided with a high heat dissipation performance. The heat sink can include a base made of metal and a fin fixed to the base. The fin can include a graphite sheet. The base has a surface coated with a film having a higher heat dissipation property than that of the metal constituting the base. The film of the base is removed from at least the region where the fin is fixed, so that the fin is fixed to the metal constituting the base.

13 Claims, 6 Drawing Sheets

Rectangular Corrugate Shape

Circular Corrugate Shape

Obtuse-angle Corrugate Shape

FIG. 9

|  | Rectangular Corrugate Shape | Circular Corrugate Shape | Obtuse-angle Corrugate Shape |
|---|---|---|---|
| Thermal Resistance Ration (vs Rectangular shape) | 1 | 0.99 | 1.01 |

HEAT SINK USING GRAPHITE AND LIGHT EMITTING DEVICE

This application claims the priority benefit under 35 U.S.C. § 119 of Japanese Patent Application No. 2015-209401 filed on Oct. 23, 2015, which is hereby incorporated in its entirety by reference.

TECHNICAL FIELD

The presently disclosed subject matter relates to heat sinks, and in particular, to a heat sink including fins formed from graphite.

BACKGROUND ART

In recent years, application products typified by electronic equipment, automobile parts, etc. having higher performance generate heat in an increased heat amount from electronic parts installed therein. In addition thereto, miniaturization and thinning of such application products have been demanded, to thereby increase the heat generation density from such electronic parts. In order to maintain the functions of such application products and ensure the reliability thereof, such parts must be kept within appropriate temperatures. In particular, optical semiconductor elements such as light emitting diodes (LEDs) and laser diodes (LDs) to be used in electronic equipment, automobile parts, etc. may have properties in which the performance and life thereof may deteriorate due to heat generated by themselves. Further, wavelength converting materials such as phosphor to be used to change emission color in combination with a light emitting element may have properties in which the performance may deteriorate due to heat generated by the light emitting element. Therefore, application products utilizing such LEDs, LDs, phosphor, etc. should be appropriately controlled to be kept at suitable heat proof temperature or lower.

In general, a heating body is provided with a heat dissipation device such as a heat sink with a mechanism in which heat generated by the heating body can be dissipated to surrounding air. The heat dissipation performance of such a heat sink can be determined on the basis of an envelope volume thereof. The larger the envelope volume is, the higher the intrinsic heat dissipation performance becomes. On the other hand, simply enlarged envelope volume may impair the miniaturization and thinning demands of such products, and thus, it would be difficult to simply increase the envelope volume. Thus, it is an important object to effectively dissipate heat of a heating body into air with a limited space (volume). Furthermore, it is also a recently important object to decrease a weight of a heat dissipation device without reducing a heat dissipation performance of the heat dissipation device with unchanged volume because of weight-saving demands.

Under these circumstances, there has been proposed a technique disclosed in Japanese Patent Application Laid-Open No. 2009-099878, in which the weight of a heat sink is reduced by using a laminate of a graphite sheet and a metal plate as a fin.

Graphite used in the heat sink disclosed in Japanese Patent Application Laid-Open No. 2009-099878 has a high heat conductivity, and thus has been expected to show a higher heat dissipation performance. The used metal thin plate can impart a rigidity to the graphite used, thus enabling the use of a graphite sheet. This can further contribute to the thinning and weight saving effects.

Even in this case where the heat sink includes a fin of graphite, however, a metal base having a high heat conductivity and a high rigidity is required to constitute the heat sink. Thus, it is impossible to perform an integral mold of the metal plate of the fin and the metal base as in the case of a general heat sink. Such a graphite-made fin and a metal base must be structurally and thermally connected to each other by any suitable means. In this context, the technique disclosed in Japanese Patent Application Laid-Open No. 2009-099878 uses a solder to bond the metal thin plate of the fin and the metal base.

Furthermore, such a base is desired to have a film with a high heat dissipation performance on its surface to improve the heat dissipation characteristics of the base itself. For example, when the base is made of aluminum, the base is subjected to an anodization process or the like to form an alumite film on its surface. Another method may include performing application of a film having a high heat dissipation property.

In order to achieve a lightweight heat sink with a higher heat dissipation performance, the inventor of this invention has confirmed a heat dissipation performance of a heat sink including a base on the surface of which a high heat dissipation film was provided and a fin formed from a laminate of graphite and a metal thin film by conducting experiments and computer simulations based on the computational fluid dynamics. As a result, the inventor has found that it was difficult to obtain a high heat dissipation performance of such a heat sink. The cause thereof has been found that the thermal resistance of the connection part between the base and the fin was too large to effectively conduct heat from the base to the graphite sheet of the fin.

SUMMARY

The presently disclosed subject matter was devised in view of these and other problems and features in association with the conventional art. According to an aspect of the presently disclosed subject matter, a heat sink can include a fin using graphite, and a base with a high heat dissipation film formed on its surface to be provided with a high heat dissipation performance.

Specifically, according to another aspect of the presently disclosed subject matter, a heat sink can include a base made of metal and a fin fixed to the base. The fin can include a graphite sheet. The base can have a surface coated with a film having a higher heat dissipation property than that of the metal constituting the base. The heat sink can further include a structure configured to conduct heat of the base to the fin. The structure can be provided in a region where the fin is fixed to the surface of the base.

The heat sink of the above aspect is configured such that the structure configured to conduct heat can be configured such that the film of the base is removed from at least the region where the fin is fixed, so that the fin can be fixed to the metal constituting the base. Alternatively, the heat sink of the above aspect is configured such that the structure configured to conduct heat can be configured such that the film has a surface with irregularities and a filling layer is disposed on the surface of the film at the region where the fin is fixed, so that the irregularities of the film is filled with the filling layer, and the filling layer is constituted by a material having a higher heat conductivity than air.

Further alternatively, the heat sink of the above aspect is configured such that the fin can further includes a metal thin plate layered on the graphite sheet. In the heat sink, the fin can have a structure in which the graphite sheet is interposed between two of the metal thin plates. Further, in the heat sink, the fin can be fixed to the base on a side of the metal thin plate.

The heat sink of the above aspect is configured such that the fin can have a bellows structure provided with mount-folded sections and valley-folded sections alternately arranged, and the fin is fixed to the regions of the base at the valley-folded sections. In the heat sink, at least any group of the mount-folded sections and the valley-folded sections can be folded by a folded angle greater than 90 degrees. Alternatively, in the heat sink, at least any group of the mount-folded sections and the valley-folded sections can be constituted by a curved surface.

According to further another aspect, a light emitting device can include: an optical semiconductor element; and a heat sink configured to dissipate heat generated by the optical semiconductor element. In this light emitting device, the heat sink includes: a base made of metal, the base having a surface coated with a film having a higher heat dissipation property than that of the metal constituting the base; a fin fixed to the base, the fin including a graphite sheet; and a structure configured to conduct heat of the base to the fin, the structure being provided in a region where the fin is fixed to the surface of the base.

BRIEF DESCRIPTION OF DRAWINGS

These and other characteristics, features, and advantages of the presently disclosed subject matter will become clear from the following description with reference to the accompanying drawings, wherein:

FIG. 9 is a table explaining the thermal resistance ratio of the fins illustrated in FIGS. 6A to 6C.

DESCRIPTION OF EXEMPLARY EMBODIMENTS

A description will now be made below to heat sinks of the presently disclosed subject matter with reference to the accompanying drawings in accordance with exemplary embodiments.

The inventor of this invention has examined and confirmed the reason why the heat dissipation performance of a heat sink including a base on the surface of which a high heat dissipation film was provided and a fin formed from graphite is not improved due to the thermal resistance of the connection part. As a result, the inventor has found that the high heat dissipation film provided on the surface of the base has a high heat dissipation performance but not a high heat conductivity, and that the thermal resistance in contact with the fin is large to prevent the heat of the base from being effectively conducted to the graphite of the fin and thus to impair the improvement in heat transfer performance. Furthermore, the inventor has found that the heat conductivity of the high heat dissipation film is not so high due to its material and the large contact thermal resistance is derived from the existence of fine irregularities on the surface of the film with high density, although the fine irregular structure of the film surface may contribute the improvement in heat dissipation performance.

In view of the foregoing findings, the inventor has provided a structure configured to conduct heat of the base to the fin, in a region where the fin is fixed to the surface of the base. In this manner, the heat of the base can be highly effectively conducted to the fin of graphite for heat dissipation.

Examples of the structure configured to conduct heat may include a structure in which a fin is fixed to metal constituting the base while removing the high heat dissipation film from the region where the fin is to be fixed; and a structure in which a layer filling the surface irregularities of the film is provided on the surface of the film at the region where the fin is to be fixed. In the latter case, this layer is desirably constituted by a material having a heat conductivity higher than air, and in particular, by a material having a heat conductivity higher than the material constituting the film.

First Exemplary Embodiment

The heat sink according to the first exemplary embodiment can include the following configuration.

Figure 1:
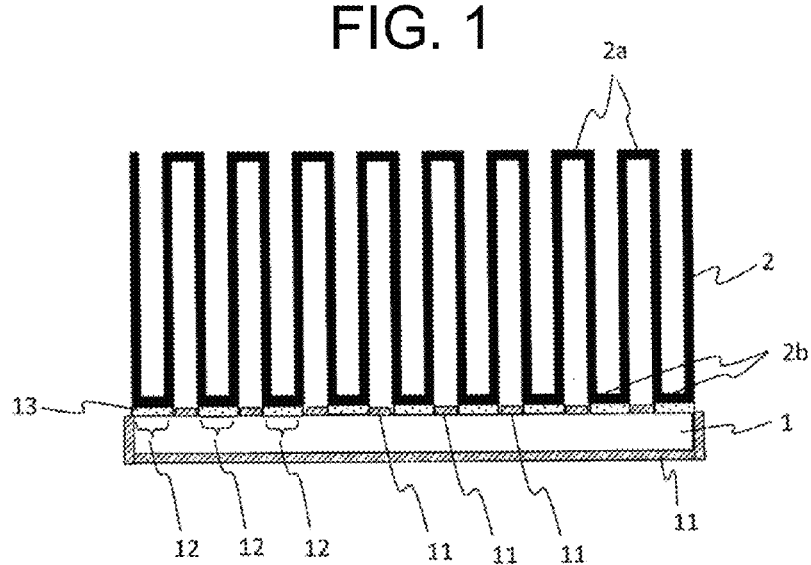
FIG. 1 is a cross-sectional view illustrating a heat sink made in accordance with principles of the presently disclosed subject matter as a first exemplary embodiment.
Figure 2A:
FIG. 2A is a cross-sectional view of a fin of the heat sink according to the first exemplary embodiment.
Figure 2B:
FIG. 2B is a cross-sectional view of a fin of the heat sink according to the first exemplary embodiment as a modified example.
Figure 3:
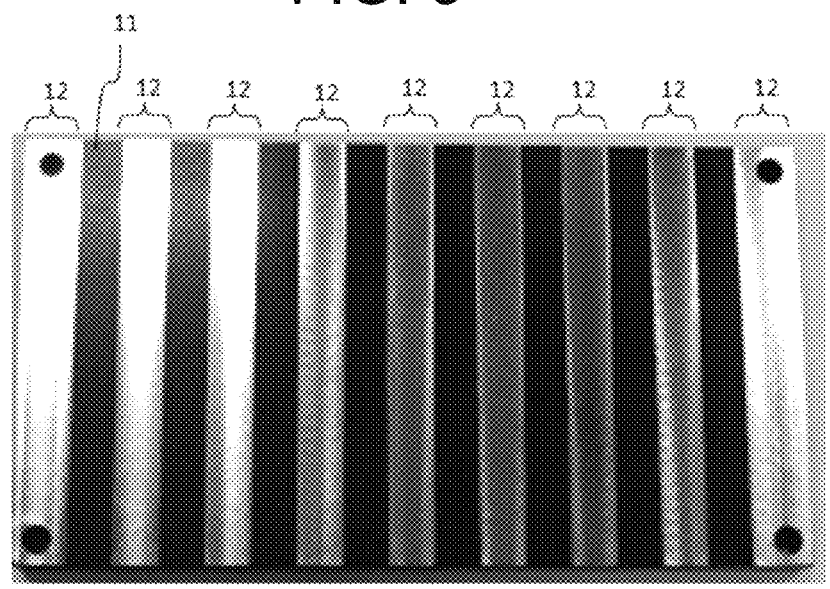
FIG. 3 is a photographic top plan view of a base of the heat sink according to the first exemplary embodiment.
Figure 4:
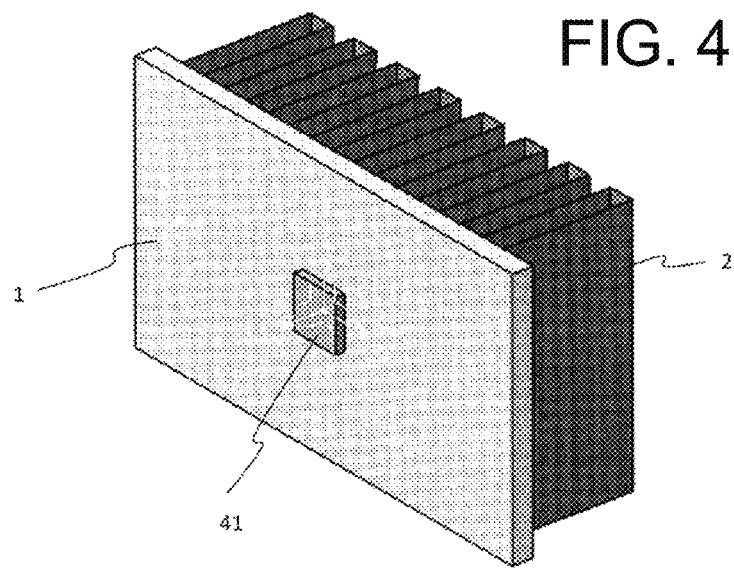
FIG. 4 is a perspective view illustrating a state where a heat source is disposed on the heat sink.

FIG. 1 is a cross-sectional view illustrating a heat sink made in accordance with the principles of the presently disclosed subject matter as a first exemplary embodiment. FIG. 2A is a cross-sectional view of a fin of the heat sink, and FIG. 2B is a cross-sectional view of a fin of the heat sink as a modified example. FIG. 3 is a photographic top plan view of a base of the heat sink. FIG. 4 is a perspective view illustrating a state where a heat source is disposed on the heat sink.

As illustrated in FIG. 1, the heat sink according to the first exemplary embodiment can include a metal base 1 and a fin 2 fixed to the base 1. The fin 2 can include a graphite sheet 20 as illustrated in FIGS. 2A and 2B. The surface of the base 1 can be coated with a film 11 having a heat dissipation property higher than that of the metal constituting the base 1. Furthermore, the film 11 of the base 1 is removed from regions 12 where the fin 2 is fixed and the fin is fixed to the metal constituting the base 1, thereby configuring the structure for heat conduction.

With this configuration, the heat of the base 1 can be dissipated from the film 11 with a high heat dissipation surface. In this configuration, since the film 11 is removed from the regions 12 where the fin 2 is fixed, the fin 2 can be fixed to the metal constituting the base 1 without the intervention of the film 11, thereby reducing the contact thermal resistance between the base 1 and the fin 2. Therefore, the heat of the base 1 can be effectively conducted to the fin 2 and then diffused by the graphite sheet 20 with the high heat conductivity to the entire fin 2 in the in-plane direction, thereby being dissipated through the fin 2 with a large area to air surrounding the fin 2.

Thus, in the present exemplary embodiment, although the heat sink includes a combination of the metal base 1 covered with the high heat dissipation film 11 and the fin 2 including the graphite sheet 20, the contact thermal resistance at the part where the fin 2 is fixed to the base 1 can be suppressed while the heat of the base 1 can be effectively conducted to, and dissipated from, the fin 2.

Since the graphite sheet 20 can have a high heat conductivity even with a relatively small thickness, the fin 2 using such the graphite sheet 20 can be thinned while being made lightweight. Therefore, with this configuration, there can be provided a lightweight heat sink with a higher heat transfer performance.

Examples of the metal constituting the base 1 may include metal such as aluminum and copper having a high heat conductivity and alloys thereof, and alloys of magnesium having low specific gravity.

The high heat dissipation film 11 to cover the base 1 is not limited to a particular film as long as the heat dissipation of the metal base 1 can be promoted. Examples thereof may include a film formed by subjecting the base 1 to a surface treatment such as an anodizing treatment, a film formed by applying a coating liquid thereto, and a film formed by adhering a film molded in advance. For example, when the base 1 is made of aluminum, the base 1 is subjected to the anodizing treatment to form an alumite film 11 in according to a known technique, thereby improving the heat dissipation performance. The film 11 can have fine irregularities on the surface thereof or reduce the surface reflectance, to thereby improving the emissivity and improving the heat dissipation performance. Thus, the material of the film 11 itself may have a heat conductivity lower than the base 1. For example, an alumite film can have a low reflectivity and include fine irregularities on its surface with a higher density, thereby improving the heat dissipation performance. If such a film 11 is interposed between the base 1 and the fin 2, the contact thermal resistance at that area may increase. However, in the present exemplary embodiment, as illustrated in FIGS. 1 and 3, the film 11 has been removed from the regions 12 where the fin 2 is attached to the base 1. Thus, the film 11 is not interposed between the base 1 and the fin 2, and the contact thermal resistance from the base 1 to the fin 2 is small.

Examples of the method of removing the film 11 from the region 12 where the fin 2 is attached to the base 1 may include a method of providing a masking at the regions 12 where the fin 2 is attached prior to a step of forming the film 11 on the base 1; and a method of removing the film 11 in the regions 12 where the fin 2 is attached to the base 1 by, for example, polishing after the step of forming the film 11 on the entire base 1. FIG. 3 is the photographic top plan view of the aluminum base 1 to which the alumite film 11 is provided, but the film 11 has been removed from the regions 12 where the fin 2 is attached. The film 11 covering the entire top surface of the base 1 on which the fin 2 is attached may be removed.

The film 11 on the base 1 is desirably removed from the area where the heat source 41 is to be installed, as illustrated in FIG. 4. Examples of the heat source 41 may include an LED and an LD which are installed on a substrate. It is desired that a thermal interface material (TIM), or a heat conducting member, such as grease, a heat conductive sheet, a heat conductive adhesive, etc. be interposed between the substrate for the heat source 41 and the base 1 in order to reduce the thermal resistance between the parts.

The fin 2 can be constituted only by the graphite sheet 20, or by a laminate of a metal thin plate 21 and the graphite sheet 20 as illustrated in FIGS. 2A and 2B. When the metal thin plate 21 is laminated on the graphite sheet 21 that has a small rigidity, the metal thin plate 21 can support the graphite sheet 21 and impart the rigidity thereto without impairing the heat conduction. Since the fin 2 can be constituted by the thin graphite sheet 20 and the metal thin plate 21, the resulting fin 2 can also be made thin and lightweight. The number of the laminated graphite sheets 20 and the number of the laminated metal thin plates 21 are not limited, and the fin 2 may be multi-layered. An alternative form of the fin 2 may be a laminate of the graphite sheet 20 and a resin film adhered thereto.

The graphite sheet 20 includes graphite crystals spread in the in-plane direction of the sheet as a layer. With this structure, the graphite sheet 20 has a heat conductivity greater in the in-plane direction than in the thickness direction. Further, the graphite sheet 20 according to this embodiment may be any graphite sheet as long as the heat conductivity thereof in the in-plane direction is greater than that of the metal thin plate 21. In addition, the thickness of the graphite sheet 20 may take any value with the aforementioned conditions satisfied.

When the fin 2 has a laminate structure of the graphite sheet 20 and the metal thin plate 21, it is possible to configure the fin 2 by the laminate in which the graphite sheet 20 is interposed between two metal thin plates 21 as illustrated in FIG. 2A. Alternatively, a single metal thin plate 21 may be placed on one surface of the graphite sheet 20 to form a laminate as illustrated in FIG. 2B. When the fin 2 is formed from the laminate of the graphite sheet 20 interposed between the metal thin plates 21 from both sides as illustrated in FIG. 2A, even if the graphite sheet 20 and the metal thin plates 21 have different coefficients of thermal expansion, warp is unlikely to occur in the laminate at higher temperatures. Thus, the graphite sheet 20 and the metal thin plates 21 are unlikely to be peeled off. On the other hand, when the fin 2 has the structure illustrated in FIG. 2B, since the surface of the graphite sheet 20 is in direct contact with the surrounding air, the heat can be dissipated directly from the graphite sheet 20 without the influence of the thermal conductivity and the heat dissipation property possessed by the metal thin plate 21.

Figure 5A:
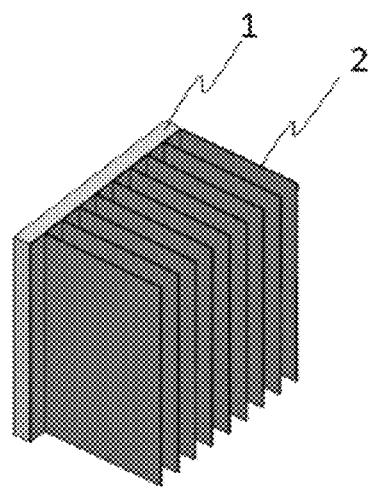
FIGS. 5A and 5B are perspective views illustrating another mode of the first exemplary embodiment.
Figure 5B:
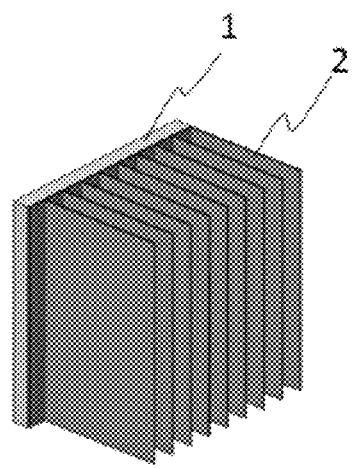
Figure 5C:
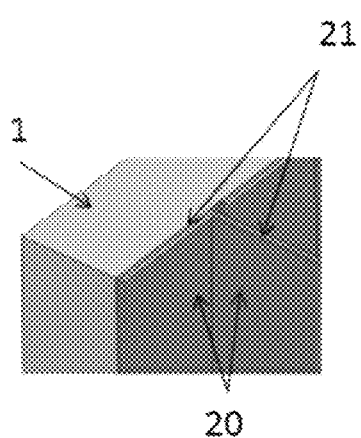
FIGS. 5C and 5D are corresponding enlarged views of FIGS. 5A and 5B, respectively.
Figure 5D:
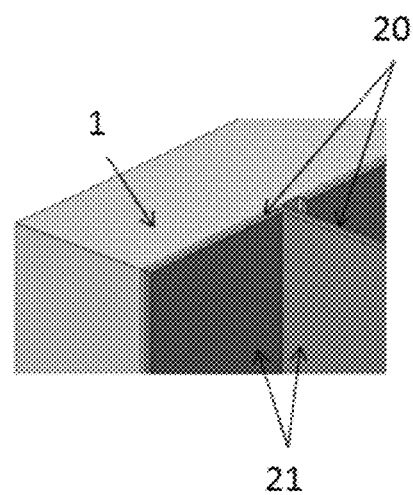

When the laminate of the graphite sheet 20 and the metal thin plate 21 disposed on one surface of the graphite sheet 20, as illustrated in FIG. 2B, is fixed to the base 1, the laminate may be fixed to the base 1 so that the surface on the metal thin plate 2 side is in contact with the metal of the base 1 as illustrated in FIGS. 5A and 5C or so that the surface on the graphite sheet 2 side is in contact with the metal of the base 1 as illustrated in FIGS. 5B and 5D, to form the fin 2. When the laminate is fixed to the base 1 so that the surface on the metal thin plate 21 side is in contact with the base 1 as illustrated in FIGS. 5A and 5C, the heat of the base 1 is conducted through the metal thin plate 21 in the thickness direction thereof to be transferred to the graphite sheet 20. Then, the transferred heat can be conducted through the graphite sheet 20 on the surface of the metal thin plate 21 opposite to the base 1 in the in-plane direction of the graphite sheet 20 (in which the heat conductivity is larger than in the thickness direction), and the heat is further conducted through the entire graphite sheet 20 erected relative to the base 1 in the in-plane direction thereof to be dissipated to the surrounding air. On the other hand, when the graphite sheet 20 side is fixed to the base 1 in contact therewith as illustrated in FIGS. 5B and 5D, the heat of the base 1 is directly conducted through the graphite sheet 20 in the in-plane direction of the graphite sheet 20 (in which the heat conductivity is larger than in the thickness direction), and the heat is further conducted through the entire graphite sheet 20 erected relative to the base 1 in the in-plane direction thereof to be dissipated to the surrounding air.

The graphite sheet 20 and the metal thin plate(s) 21 can be laminated together with the aid of an adhesive or the like material applied to the interface therebetween. There is no particular limitation on the type of the adhesive used. Examples thereof may include those adhesives disclosed in Japanese Patent Application Laid-Open No. 2012-136022.

The fin 2 can be formed in any appropriate shape. For example, as illustrated in FIG. 1, the fin 2 can continuously and alternately include mountain-folded sections 2a and valley-folded sections 2b to form a bellows structure. In this case, the valley-folded sections 2b of the fin 2 can be fixed to the top surface of the base 1, as illustrated in FIG. 1.

Other examples of the shape of the fin 2 than the bellows structure may include a structure, as illustrated in FIGS. 5A and 5B, in which a plurality of fins 2 are disposed on the base 1 to erect. Specifically, the plurality of fins 2 are bent at respective ends, and the bent portions are fixed to the metal base 1 as illustrated.

The fin 2 with the bellows structure illustrated in FIG. 1 is advantageous more than the plurality of fins 2 separately provided as illustrated in FIGS. 5A and 5B. In the former case, even when the fin 2 made from the laminate of the graphite sheet 20 and the metal thin plate 21 has a small rigidity, the bellows structure can impart a larger rigidity to the entire structure of the fin 2, to thereby maintain the shape of the fin. Further, due to this bellows structure of the fin 2 illustrated in FIG. 1, the fin 2 of FIG. 1 can be advantageously lightweight more than the fins 2 with the structure of FIGS. 5A and 5B. On the other hand, the structure of FIGS. 5A and 5B in which the plurality of fins 2 are separately disposed on the base 1 to erect therefrom has an advantageous effect in which the degree of freedom in terms of air flowing directions between the fins increases when compared with the fin 2 with the bellows structure of FIG. 1. This contributes to the increased degree of freedom of arranging the heat sink. Because of these reasons, the shape of the fin 2 can be appropriately selected in accordance with the required specification of the heat sink.

The method of fixing the fin 2 to the base 1 in which the film 11 has been removed may be any appropriate method. Examples of the method of fixing the fin 2 may include a method of bonding the fin 2 with a bonding material 13 or means, as illustrated in FIG. 1, such as an adhesive, welding, brazing, and soldering; and a method of fixing the fin 2 mechanically, such as by screwing and caulking, to the base 1 in which the film 11 has been removed.

Figure 6A:
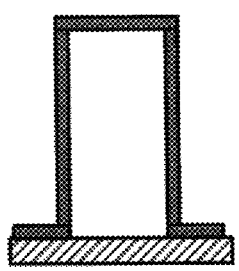
FIGS. 6A to 6C are each a cross-sectional view illustrating a variation of a fin of the heat sink illustrated in FIG. 1.
Figure 6B:
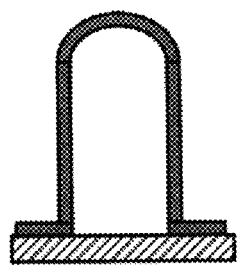
Figure 6C:
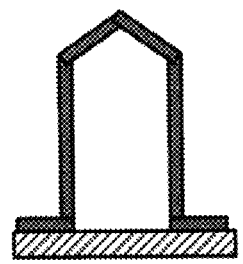

A description will now be given of the folded (bent) sections of the fin 2. Although the heat conductivity of the graphite sheet 20 in the in-plane direction is high, when the sheet is ruptured, the heat dissipation performance may deteriorate due do disconnection of the heat conduction. In order to prevent the graphite sheet 20 from being broken or torn at the folded sections of the fin 2, it is preferable that the folded angle of the fin 2 be an obtuse angle or the section be a curved surface. Specifically, when the fin 2 has the bellows structure as illustrated in FIG. 1, the mountain-folded sections 2a and the valley-folded sections 2b may have a rectangular cross section with the folded angle of 90 degrees as illustrated in FIG. 6A, but any group of the mountain-folded sections 2a and the valley-folded sections 2b may preferably have a cross section with the folded angle being an obtuse angle (greater than 90 degrees) as illustrated in FIG. 6C. In an alternative example, any group of the mountain-folded sections 2a and the valley-folded sections 2b may preferably have a curved cross section (have a curved surface) as illustrated in FIG. 6B. With these configurations, the rupture of the graphite sheet 20 can be prevented to maintain the high heat conduction performance.

A description will now be given of the advantage of use of such a graphite sheet for the fin 2 with reference to the following formula (1):

$$\text{Thermal resistance } (K/W) = [\text{length } (m)]/[\text{heat conductivity } (W/m \cdot K) \times \text{area } (m^2)] \qquad (1).$$

The formula (1) is a formula for a one-dimensional conduction heat resistance. The smaller the thermal resistances of the base 1 and the fin 2 are, the more the temperature of the heat source 41 can be lowered. It can be confirmed from the formula (1) that it is advantageous that the base 1 and the fin 2 each have a higher heat conductivity, and the shapes thereof each have a shorter length and a larger cross-sectional area. This is because the thermal resistance becomes small.

The heat generated from the heat source 41 can be transferred to the base 1 and spread thereinside. Then, the heat can be conducted to the fin 2 and dissipated from the fin 2 to air due to radiation and convection flow. If a heat sink has a base with the same shape and the same heat conductivity, the heat dissipation performance of the heat sink can be determined by the shape and the heat conductivity of a fin. The heat conductivity of a general aluminum-made fin produced by die-casting, for example, an aluminum alloy ADC12 for die-casting is 92 W/mK. The use of such an aluminum alloy ADC12 needs a certain draft angle under the molding condition of the fin such that the base end of the fin closer to the base is made thick while the tip end thereof farther from the base is made thin, and thus, the thickness of the fin is about 1 mm to 2 mm. On the other hand, the heat conductivity of a graphite sheet in the in-plane direction is 800 W/mK to 1,500 W/mK, and the thickness thereof is generally several μm to several hundreds μm. Accordingly, when such a graphite sheet is used for the fin 2, the cross-sectional area of the fin 2 is smaller than the case using the aluminum alloy ADC12 due to the material thickness. In this case, the heat conductivity of the graphite is significantly larger than the aluminum alloy, it can be understood from the formula (1) that the thermal resistance of the fin using the graphite sheet can be made smaller than that of the fin using aluminum alloy. Thus, the use of the graphite sheet 20 for the fin 2 can provide a heat sink using a thin and lightweight fin 2 with excellent heat dissipation properties.

The distance between the folded sections of the fin 2 or between adjacent separate fins 2 of the heat sink according to this exemplary embodiment is preferably substantially equidistance of about 5 mm to 10 mm when the heat sink is intended to be used as a natural air cooling type. All the heights of the mount-folded sections 2a of the fin 2 or the separate fins 2 may be the same or not. It is preferable that the mount-folded sections 2a of the fin 2 or the separate fins 2 near the heat source are formed to be high. If the heat sink interferes with surrounding parts, the height of the mount-folded sections 2a of the fin 2 or the separate fins 2 may be variable.

In the aforementioned exemplary embodiment, the film 11 for enhancing the heat dissipation performance is not formed on the surface of the fin 2, but it is not limitative. Such a film may be formed on the surface of the fin 2. For example, when aluminum is used as the metal thin plate 21 of the fin 2, an alumite film 11 may be formed thereon except for a surface where the graphite sheet 20 is attached. Furthermore, the entire surface of the fin 2 may have such a film 11 formed by coating and the like.

The heat sink according to this exemplary embodiment is small and lightweight, and thus is suitable for use in a light source of a vehicle lamp or illumination device utilizing an optical semiconductor element such as an LED and an LD, which are electronic components serving as a heat source. The heat sink according to this exemplary embodiment can be suitably used for heat dissipation by means of a cooling effect by natural air cooling without the use of a fan. Thus, a high performance, lightweight heat sink can be provided.

When the heat sink according to this exemplary embodiment is used in a vehicle headlamp, an illumination device, a fog lamp, a DRL lamp, etc., the small and lightweight heat sink can effectively dissipate heat from the light source, thereby capable of providing a small, lightweight device as a whole.

Second Exemplary Embodiment

A description will now be given of a heat sink according to a second exemplary embodiment with reference to FIG. 7.

Figure 7:
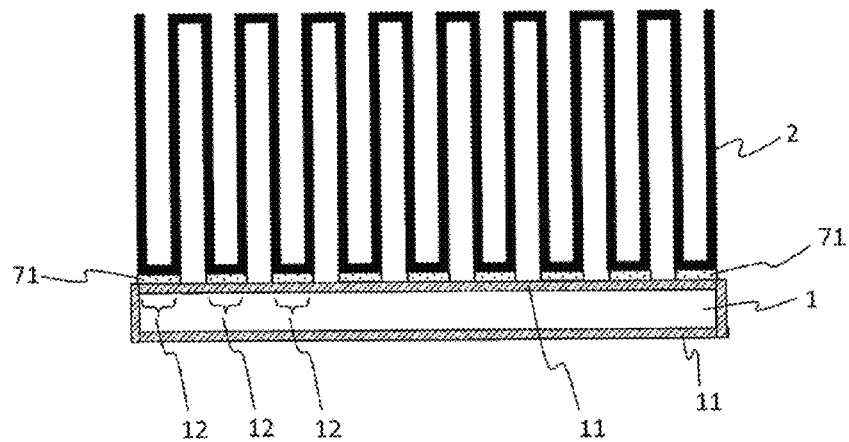
FIG. 7 is a cross-sectional view illustrating a heat sink made in accordance with the principles of the presently disclosed subject matter as a second exemplary embodiment.

As illustrated in FIG. 7, the heat sink according to the second exemplary embodiment can have the same configuration as that of the heat sink according to the first exemplary embodiment illustrated in FIG. 1, except that the structure of the regions 12 where the fin 2 is fixed to the base 1. In the second exemplary embodiment, the structure of the regions 12 is configured such that the film 11 has not been removed and a filling layer 71 configured to fill the irregularities of the surface of the film 11 is disposed on the surface of the film 11 at the regions 12. The filling layer 71 can be constituted by a material having a higher heat conductivity than air, and in particular, by a material having a higher heat conductivity than the material constituting the film 11.

Figure 8A:
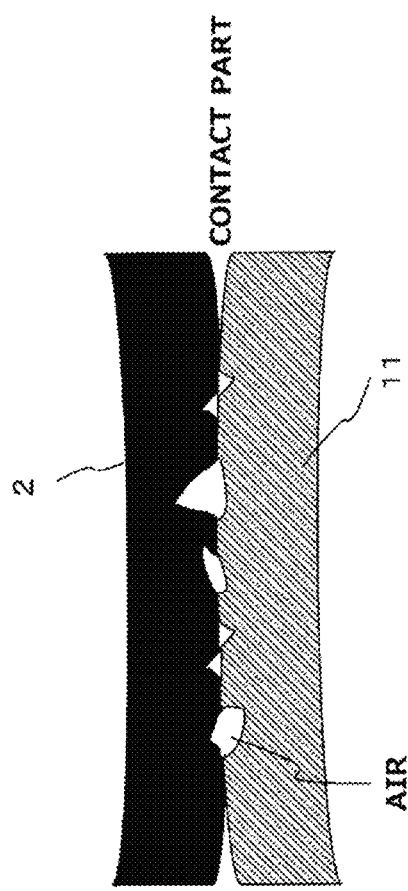
FIG. 8A is a cross-sectional view illustrating a contact part between a film 11 and a fin 2 when a filling layer 71 is not disposed.
Figure 8B:
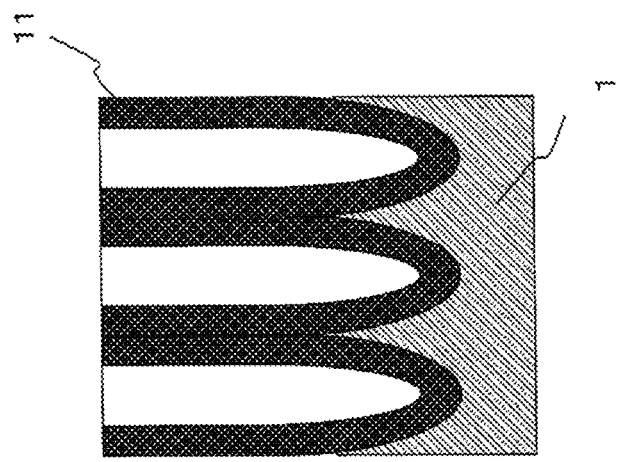
FIG. 8B is a cross-sectional view illustrating a film 11 of an alumite layer on the surface of the base 1.

When such a filling layer 71 is not provided, the contact part between the film 11 of the metal alloy-made base 1 and the fin 2 is an aggregate of fine contact parts due to undulation of the surfaces of the film 11 of the base 1 and the fin 2, which is macroscopically present, and due to surface roughness of the film 11 and the fin 2, which is microscopically present, as illustrated in FIG. 8A. In particular, when the base 1 is made of aluminum and the film 11 is an alumite layer formed by anodizing the aluminum of the base 1, the surface is porous as illustrated in FIG. 8B to include fine irregularities with high density. As a result, the contact thermal resistance between the alumite film 11 and the fin 2 may increase.

To cope with this problem, the second exemplary embodiment is configured such that the filling layer 71 made of a high heat conductive material is disposed between the film 11 of the base 1 and the fin 2, as illustrated in FIG. 7, so as to fill the undulation and fine irregularities of the film 11. This configuration can reduce the contact thermal resistance derived from the undulation and fine irregularities between the parts. The material for the filling layer 71 can be those having a high heat resistance, a favorable coatability, and a good adhesion, and being flexible. Specific examples thereof may include materials in which heat conductive fillers or particles made of, for example, metal, carbon, and ceramics are mixed to a base material such as a silicone resin or an epoxy resin. Since such a material can show the heat conductivity of 1 W/mK to 30 W/mK, which is 1,000 times or more the heat conductivity of air, i.e., 0.257 W/mK, the contact thermal resistance can be remarkably reduced. A material of which adhesion is not so good can be used as the material of the filling layer 71. In this case, the bonded parts of the fin 2 and the base 1 can be strengthened by metal or resin and be fixed mechanically by screws and nuts.

The other structure of the heat sink according to the second exemplary embodiment is the same as that of the first exemplary embodiment, and a description thereof will be omitted.

As described above, although the heat sink according to the second exemplary embodiment has the structure in which the film 11 of the base 1 is not removed at the bonded parts between the base 1 and the fin 2 utilizing the graphite sheet, the heat sink can have a high heat dissipation performance by disposing the filling layer 71 configured to fill the surface irregularities of the film 11.

Example 1

As Example 1, heat sinks having the respective structures illustrated in FIGS. 5A (5C) and 5B (5D) were produced, and the heat dissipation performances thereof were calculated on the basis of computer simulation based on the computational fluid dynamics.

Specifically, an aluminum thin plate with a thickness of about 0.2 mm was prepared as the metal thin plate 21. A graphite sheet 20 was layered on one surface of the metal thin plate 21 and the layered product was bent by 90 degrees to prepare a plurality of fins 2 as illustrated in FIGS. 5A and 5B. As illustrated in FIGS. 5A and 5B, the bent fins 2 were configured such that the metal thin plate 21 was positioned outside in the heat sink of FIG. 5A (FIG. 5C) and the graphite sheet 20 was positioned outside in the heat sink of FIG. 5B (FIG. 5D).

An aluminum plate with a predetermined size was prepared and subjected to an anodization treatment to form an alumite film 11 on its surface, to serve as the base 1. It should be noted that regions 12 where the fins 2 are to be fixed were covered with a mask in advance to prevent the alumite film 11 from being formed in the regions 12. After removing the mask, the fins 2 were fixed to the regions 12 of the base 1 with a heat conductive adhesive. Note that the heat conductive adhesive was prepared by mixing ceramic particles to a silicone resin as a base material. As a result, the exemplary heat sinks of FIG. 5A (FIG. 5C) and FIG. 5B (FIG. 5D) were produced.

As Comparative Example, a heat sink was produced in the same manner as in Examples of FIGS. 5A(5C) and 5B(5D) except that a fin including only a metal thin plate 21 without a graphite sheet was prepared and used as the fin 2.

A heat source with the same heat generation amount was fixed to a rear surface of the base 1 of each of the heat sinks of Examples and Comparative Example. The temperature of the heat source was calculated by computer simulation based on the computational fluid dynamics. As a result, the temperature of the heat source fixed to the heat sink of Comparative Example (using the aluminum thin plate fin) was 51.4° C. In contrast, the temperature of the heat source fixed to the heat sink in which the surface on the side of the metal thin plate 21 of the fin 2 was fixed to the base 1 as illustrated in FIG. 5A(5C) was 46.9° C., and the temperature of the heat source fixed to the heat sink in which the surface on the side of the graphite sheet 20 of the fin 2 was fixed to the base 1 as illustrated in FIG. 5B(5D) was 46.8° C.

On the basis of these simulation results, the heat sinks of Example of FIGS. 5A(5C) and 5B(5D) were confirmed to have improved heat dissipation performance when compared with Comparative Example using only the aluminum thin plate fin. Furthermore, there was no substantial difference between the temperatures of the heat sources used in the respective heat sinks of Example of FIGS. 5A(5C) and 5B(5D). Therefore, the fins 2 with the graphite sheet 20 attached to any side of the metal thin plate 21 had almost the same heat dissipation performance.

Since a graphite sheet has a heat conductivity greater in the in-plane direction than in the thickness direction, it had been predicted that the structure in which the graphite sheet 20 was interposed between the base 1 and the metal thin plate 21 as illustrated in FIG. 5B(5D) would have an increased thermal resistance. However, according to the actual examination, it was confirmed that there was no substantial difference in heat dissipation performance between the heat sinks of FIGS. 5A(5C) and 5B(5D). Although it is not certain, the reason therefor was considered that the film 11 of the base 1 was removed from the regions 12 which the fins 2 were in contact with and the contact thermal resistance between the base 1 and the fins 2 decreased to effectively conduct the heat from the base 1 to the graphite sheet 20.

Example 2

As Example 2, a fin 2 with a layered structure of a graphite sheet 20 interposed between metal thin plates 21, as illustrated in FIG. 2A, was prepared to have a bellows structure of FIG. 1. The bellows structure was configured such that the mountain-folded sections 2a of the fin 2 are bent at right angle twice (rectangular corrugate shape of FIG. 6A), curved (circular corrugate shape of FIG. 6B), or bent at an obtuse angle three times (obtuse-angle corrugate shape of FIG. 6C). The obtained three type fins 2 were simulated for calculating a thermal resistance ratio. The results thereof are shown in Table of FIG. 9.

As clear from FIG. 9, it was found that the fin with the circular corrugate shape was improved in heat dissipation performance relative to the fin with the rectangular corrugate shape while the fin with the obtuse-angle corrugate shape was deteriorated in heat dissipation performance. It is considered that the fin with the circular corrugate shape has the higher heat dissipation performance with the same envelope volume because the heat conductive area thereof is maximum among three. Furthermore, since the fin with the circular corrugate shape has folding lines only at the valley-folded sections 2b, the number of the folding lines of the fin with the circular corrugate shape was half the number of the folding lines of the fin with the rectangular corrugate shape. This can reduce the probability of performance deterioration.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A heat sink comprising:
a base made of metal, the base having a surface coated with a film having a higher heat dissipation property than that of the metal constituting the base;
a fin fixed to the base, the fin including a graphite sheet; and
a structure configured to conduct heat of the base to the fin, the structure being provided in a region where the fin is fixed to the surface of the base, wherein
the structure configured to conduct heat is configured such that the film has a surface with irregularities and a filling layer is disposed on the surface of the film at the region where the fin is fixed, so that the irregularities of the film is filled with the filling layer, and
the filling layer is constituted by a material having a higher heat conductivity than air.

2. The heat sink according to claim 1, wherein
the fin further includes a metal thin plate layered on the graphite sheet.

3. The heat sink according to claim 2, wherein
the fin has a structure in which the graphite sheet is interposed between two of the metal thin plates.

4. The heat sink according to claim 2, wherein
the fin is fixed to the base on a side of the metal thin plate.

5. The heat sink according to claim 1, wherein
the fin has a bellows structure provided with mount-folded sections and valley-folded sections alternately arranged, and
the fin is fixed to the regions of the base at the valley-folded sections.

6. The heat sink according to claim 5, wherein
at least any group of the mount-folded sections and the valley-folded sections is folded by a folded angle greater than 90 degrees.

7. The heat sink according to claim 5, wherein
at least any group of the mount-folded sections and the valley-folded sections is constituted by a curved surface.

8. A light emitting device comprising:
an optical semiconductor element; and
a heat sink configured to dissipate heat generated by the optical semiconductor element, wherein
the heat sink includes:
a base made of metal, the base having a surface coated with a film having a higher heat dissipation property than that of the metal constituting the base;
a fin fixed to the base, the fin including a graphite sheet; and
a structure configured to conduct heat of the base to the fin, the structure being provided in a region where the fin is fixed to the surface of the base, wherein
the structure configured to conduct heat is configured such that the film has a surface with irregularities and a filling layer is disposed on the surface of the film at the region where the fin is fixed, so that the irregularities of the film is filled with the filling layer, and
the filling layer is constituted by a material having a higher heat conductivity than air.

9. The heat sink according to claim 1, wherein the film is an anodized film.

10. The light emitting device according to claim 8, wherein the film is an anodized film.

11. A heat sink comprising:
a base made of metal, the base having a surface coated with a film having a higher heat dissipation property than that of the metal constituting the base;
a fin fixed to the base, the fin including a graphite sheet and a metal thin plate layered on the graphite sheet; and
a structure configured to conduct heat of the base to the fin, the structure being provided in a region where the fin is fixed to the surface of the base, wherein
the structure configured to conduct heat is configured such that the film of the base is removed from at least the region where the fin is fixed, so that the fin is fixed to the metal constituting the base.

12. The heat sink according to claim 11, wherein
the metal constituting the base is one selected from the group consisting of aluminum, copper, an alloy thereof, and an alloy of magnesium,
the metal thin plate of the fin is bonded to an exposed surface of the metal constituting the base at the region where the fin is fixed, and
the base and the fin at regions other than the region where the fin is fixed are provided with the film that is an anodized film having fine irregularities.

13. A light emitting device comprising:
an optical semiconductor element; and
a heat sink configured to dissipate heat generated by the optical semiconductor element, wherein
the heat sink includes:
   a base made of metal, the base having a surface coated with a film having a higher heat dissipation property than that of the metal constituting the base;
   a fin fixed to the base, the fin including a graphite sheet and a metal thin plate layered on the graphite sheet; and
   a structure configured to conduct heat of the base to the fin, the structure being provided in a region where the fin is fixed to the surface of the base, wherein
the structure configured to conduct heat is configured such that the film of the base is removed from at least the region where the fin is fixed, so that the fin is fixed to the metal constituting the base,
the metal constituting the base is one selected from the group consisting of aluminum, copper, an alloy thereof, and an alloy of magnesium,
the metal thin plate of the fin is bonded to an exposed surface of the metal constituting the base at the region where the fin is fixed, and
the base and the fin at regions other than the region where the fin is fixed are provided with the film that is an anodized film having fine irregularities.

* * * * *